United States Patent
Pribble et al.

(10) Patent No.: US 7,236,053 B2
(45) Date of Patent: Jun. 26, 2007

(54) HIGH EFFICIENCY SWITCH-MODE POWER AMPLIFIER

(75) Inventors: William L. Pribble, Apex, NC (US);
James W. Milligan, Cary, NC (US);
Raymond S. Pengelly, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 108 days.

(21) Appl. No.: 11/132,619

(22) Filed: May 18, 2005

(65) Prior Publication Data
US 2006/0145761 A1    Jul. 6, 2006

Related U.S. Application Data

(60) Provisional application No. 60/640,269, filed on Dec. 31, 2004.

(51) Int. Cl.
*H03F 3/217*  (2006.01)

(52) U.S. Cl. .................... 330/251; 330/207 A

(58) Field of Classification Search ............ None
See application file for complete search history.

(56) References Cited

U.S. PATENT DOCUMENTS

| | | | |
|---|---|---|---|
| 3,919,656 A | 11/1975 | Sokal et al. | 330/51 |
| 4,946,547 A | 8/1990 | Palmour et al. | 117/97 |
| 5,187,580 A * | 2/1993 | Porter et al. | 330/251 |
| 5,200,022 A | 4/1993 | Kong et al. | 117/95 |
| 5,210,051 A | 5/1993 | Carter, Jr. | 438/22 |
| 5,292,501 A | 3/1994 | Degenhardt et al. | 424/49 |
| 5,393,993 A | 2/1995 | Edmond et al. | 257/77 |
| 5,523,589 A | 6/1996 | Edmond et al. | 257/77 |
| 5,939,941 A * | 8/1999 | Nair et al. | 330/251 |
| 6,218,680 B1 | 4/2001 | Carter, Jr. et al. | 710/66 |
| 6,316,793 B1 | 11/2001 | Sheppard et al. | 257/103 |
| 6,724,255 B2 * | 4/2004 | Kee et al. | 330/251 |

* cited by examiner

*Primary Examiner*—Khanh Van Nguyen
(74) *Attorney, Agent, or Firm*—Myers Bigel Sibley & Sajovec, PA

(57) ABSTRACT

A switch mode power amplifier includes a transistor responsive to input signals above 1.0 GHz and which includes one terminal coupled to ground and another terminal conductively coupled to a power source. A resonant circuit coupled the second terminal to an output with a resistive load coupled across the output and ground. When the transistor is turned on the second terminal is coupled to ground and when the transistor is turned off, current from the power supply to the second terminal is steered into internal capacitance of the transistor and causes voltage on the second terminal to rise to a maximum value and then decrease, the voltage at the second terminal being coupled to the output terminal through the resonant circuit. In preferred embodiments, the transistor comprises a compound semiconductor field effect transistor with the first terminal being a source terminal and the second terminal being a drain terminal. The field effect transistor is preferably a compound high electron mobility transistor (HEMT) or compound MESFET, but in other embodiments the transistor can be the compound LDMOS, compound bipolar transistor, or compound MOSFET.

19 Claims, 5 Drawing Sheets

HIGH EFFICIENCY SWITCH-MODE POWER AMPLIFIER

CROSS REFERENCE TO RELATED APPLICATIONS

This patent application claims priority under 35 USC 119 from Provisional Patent Application No.: 60/640,269 filed Dec. 31, 2004, which is incorporated herein by reference for all purposes.

BACKGROUND

Switch-mode power amplifiers have attracted a significant amount of interest for use in applications requiring highly efficient power amplification of high frequency signals. Examples of applications of such devices include power amplifiers for wireless communications systems, satellite communications systems, and advanced radar systems. In particular, high power, high frequency power amplifiers are needed for digital communication systems such as 3G and 4G PCS systems, WiFi, WiMax and digital video broadcast systems. For applications requiring high output power, the power amplifier accounts for a significant portion of the overall power consumed by the system. Thus, it is desirable to maximize the efficiency of the power amplifier circuit in a communication system.

Switch-mode amplifiers, for example amplifiers operating in Class D, E, F or S, provide high efficiency amplification by minimizing the amount of power dissipated in the transistor. Since switch-mode amplifiers are highly non-linear, they are particularly suitable for use in connection with digital systems which employ constant-envelope modulation schemes. However, switch-mode amplifiers can also be used in other applications by providing additional circuitry for extracting amplitude information from the input signal and restoring the amplitude information to the output signal.

In a Class E amplifier, the transistor operates as an on-off switch whose state is driven by a time-varying input signal. The binary output of the transistor is applied to a reactive load network which filters out harmonic components of the transistor output signal, resulting in a narrow bandwidth, amplified output signal. In the Class E configuration, the transistor drain current is minimized (ideally zero) whenever a drain voltage is present on the device, and the drain voltage is minimized (ideally zero) whenever there is a drain current passing through the device. Since the power dissipated in the transistor is equal to the instantaneous product of the drain current and the drain voltage averaged over a period, the power loss in a Class E device is ideally zero. Thus, a Class E device can theoretically operate at 100% drain efficiency. The efficiency of actual devices is lower than 100%. Nevertheless, very high efficiencies can be realized in Class E amplifiers.

To date, Class E amplifiers have been realized primarily using narrow bandgap (silicon and GaAs) bipolar, MOSFET and MESFET technology. Bipolar and MOSFET devices have demonstrated high power output at frequencies below 1.0 GHz. However, such devices are unsuitable for higher frequency applications which demand higher transistor switching speeds. High frequency amplifiers (i.e. amplifiers capable of operating at frequencies at or above 1.0 GHz) have been realized using GaAs MESFETs. However, the resulting amplifiers are not capable of high power output desired for communications applications (particularly base station applications), and the efficiencies of such devices are less than ideal. In particular, GaAs MESFET devices have limited power density and limited drain voltage, which limits the amount of power they can produce.

Accordingly, there is a continued need for a single-stage switch-mode amplifier circuit capable of producing in excess of 10W of output power at frequencies exceeding 1.0 GHz. Furthermore, there is a need for a switch-mode amplifier circuit capable of power added efficiency in excess of 75% at frequencies exceeding 1.0 GHz.

SUMMARY

A single-stage switch-mode amplifier circuit includes an active device switch transistor configured to operate in either an ON state or an OFF state depending on the signal level of an input signal. The switch transistor has an output connected to a load network which filters the signal output from the switch transistor to provide a narrow-bandwidth output signal to a load impedance. Energy rejected by the load network is stored in a switch capacitor which continues to drive the output signal while the switch transistor is in the OFF state. Drain voltage to the switch transistor is provided through a drain inductor which prevents instantaneous changes in source current. In some embodiments, the amplifier operates in Class E mode.

In some embodiments, a switch mode amplifier circuit includes an input matching stage, an active stage and an output matching stage. The active stage includes an active device switch transistor in parallel with a switch capacitor. The switch transistor has an output connected to a load network and a load impedance. The output of the device, which comprises the voltage across the load impedance, is supplied to the output matching stage, which transforms the output impedance of the active stage to the desired output impedance of the circuit. In other embodiments, multiple active transistor stages and matching networks may be used to provide additional amplifier gain (e.g. 2-stage amplifiers, etc.)

The switch transistor can comprise a wide bandgap transistor capable of sustaining high drain voltages and/or high current levels while operating at frequencies in excess of 1.0 GHz. In some embodiments, the switch transistor comprises a gallium nitride (GaN) based high electron mobility transistor (HEMT). In some embodiments, the switch transistor comprises a GaN based HEMT having a total gate periphery of about 3.6 mm. In some embodiments, the switch transistor comprises a GaN MESFET. In other embodiments, the switch transistor comprises a different wide bandgap high frequency transistor, such as a SiC MESFET, SiC LDMOS, SiC bipolar transistor, or GaN MOSFET device.

Embodiments of the invention provide a single-stage switch-mode amplifier capable of producing 8 watts or more of peak RF output power at a power added efficiency (PAE) greater than 75% at frequencies greater than or equal to 1.0 GHz. Embodiments of the invention comprise a switch-mode amplifier tuned for operation at 2 GHz or above. Particular embodiments of the invention comprise a switch-mode amplifier tuned for operation at 2.8 GHz.

In some embodiments, the invention provides a single-stage switch mode amplifier capable of power output greater than 39 dBm at a frequency greater than 1.0 GHz. In some embodiments, the invention provides a single-stage switch mode amplifier capable of power output in excess of 39 dBm with power added efficiency greater than 75% at a frequency greater than 1.0 GHz. Conventional Class E amplifiers have been limited to total power outputs of less than 2 watts at frequencies at or above 1.0 GHz. Embodiments of the invention are capable of power output more than four times the output obtainable using conventional techniques at similar frequencies.

In some embodiments, the invention comprises a wide bandgap-based microwave monolithic integrated circuit (MMIC) such as a SiC or GaN MMIC.

The invention and objects and features thereof will be more readily apparent from the following detailed description and appended claims when taken with the drawings.

DETAILED DESCRIPTION

Figure 1:
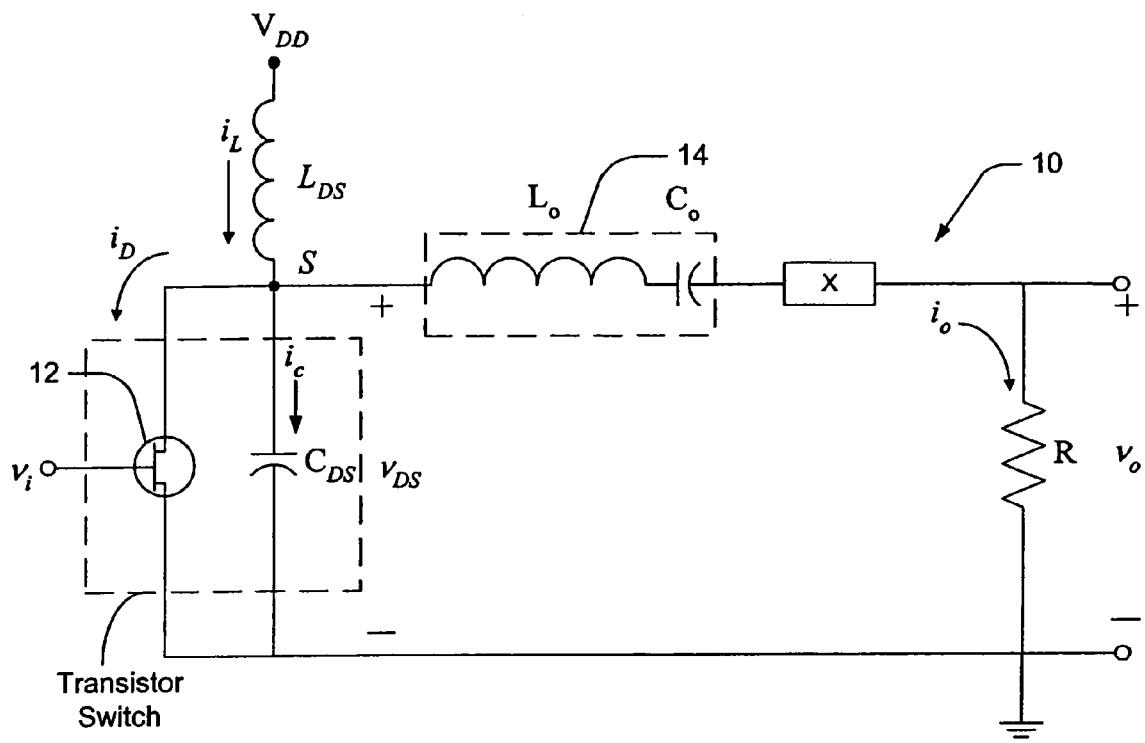
FIG. 1 is a schematic of one embodiment of a switch mode power amplifier in accordance with the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them. For brevity, when the term AlInGaN is used herein without specification of relative percentages for the Group III elements (Al, In and Ga), it will be understood to refer to a compound of the general formula $InAlGaN$ where $x+y+z=1$, $0 \leq x \leq 1$, $0 \leq y \leq 1$, and $0 \leq z \leq 1$. Thus, as used herein, the term InAlGaN may refer to GaN, InN, AlN, AlGaN, AlInN, InGaN and/or AlInGaN unless otherwise specified or limited. Accordingly, the terms "InAlGaN", "Group III-nitride material" and "nitride-based material" are used interchangeably throughout this specification.

Principles of operation of Class E amplifiers are known in the art. Class E amplifier circuits are described, for example, in U.S. Pat. No. 3,919,656 to Sokal et al.

Referring now to FIG. 1, a single-stage class E amplifier circuit model 10 in accordance with embodiments of the invention is illustrated. While the amplifier circuit model 10 in FIG. 1 is illustrated as a collection of lumped components, actual implementations of the circuit may be made using distributed elements such as microstrip transmission lines, striplines, slotlines, and/or coplanar transmission lines. The design of distributed element class E amplifier circuits is described in T. Mader and Z. Popovic, "The Transmission Line High Efficiency Class-E Amplifier," IEEE Microwave and Guided Wave Letters, Vol. 5, No. 9, pp. 290–292 (1995).

The operation of the circuit is best understood with reference to a lumped-element diagram, however.

Amplifier 10 includes a transistor 12 comprising a wide bandgap transistor which functions as an on/off switch. In some embodiments, the transistor 12 comprises a GaN HEMT. Transistor 12 may alternatively comprise a different wide bandgap high-frequency transistor, such as a SiC MESFET, GaN MESFET, SiC LDMOS, SiC bipolar transistor, or GaN MOSHFET device.

An input voltage signal vi is applied to the gate of transistor 12, which controls the state of the transistor 12. The input voltage signal vi is biased close to the pinch-off voltage of the transistor 12. The drain of the transistor 12 is coupled to an output node S, and the source of transistor 12 is coupled to ground. A supply voltage VDD is coupled to output node S via an inductor LDS. The voltage at output node S is applied to a series resonant circuit 14 which comprises an inductor $L_0$ and a capacitor $C_0$. In some applications, the series resonant circuit 14 may be a bandpass circuit tuned to pass a narrow range of frequencies centered on the desired output frequency $f_0$ of the amplifier circuit 10. In other applications such as radar applications, the series resonant circuit may be tuned to pass a broader range of frequencies. At the output frequency, the transistor output is presented with a load equal to R+jX, where X is the reactance of the resonant circuit seen at the output.

When the transistor 12 is in the on state (i.e. the transistor is saturated), the device acts as a short circuit to ground, pulling the voltage at node S to zero. Current through the inductor $L_{DS}$ then increases linearly. When the transistor is turned off, the current through $L_{DS}$ is steered into the drain-source capacitance $C_{DS}$, causing the voltage at node S to rise until it reaches a maximum, at which point the voltage at node S begins to decrease as the drain-source capacitance $C_{DS}$ begins to source current back to the load. The resonant circuit 14 is tuned such that in steady state, the voltage at node S returns to approximately zero before the transistor is turned on again.

The resonant circuit 14 ideally passes only the fundamental frequency of the voltage at node S. The input voltage vi may carry modulated frequency or phase information that is present in the amplified output signal.

Figure 4:
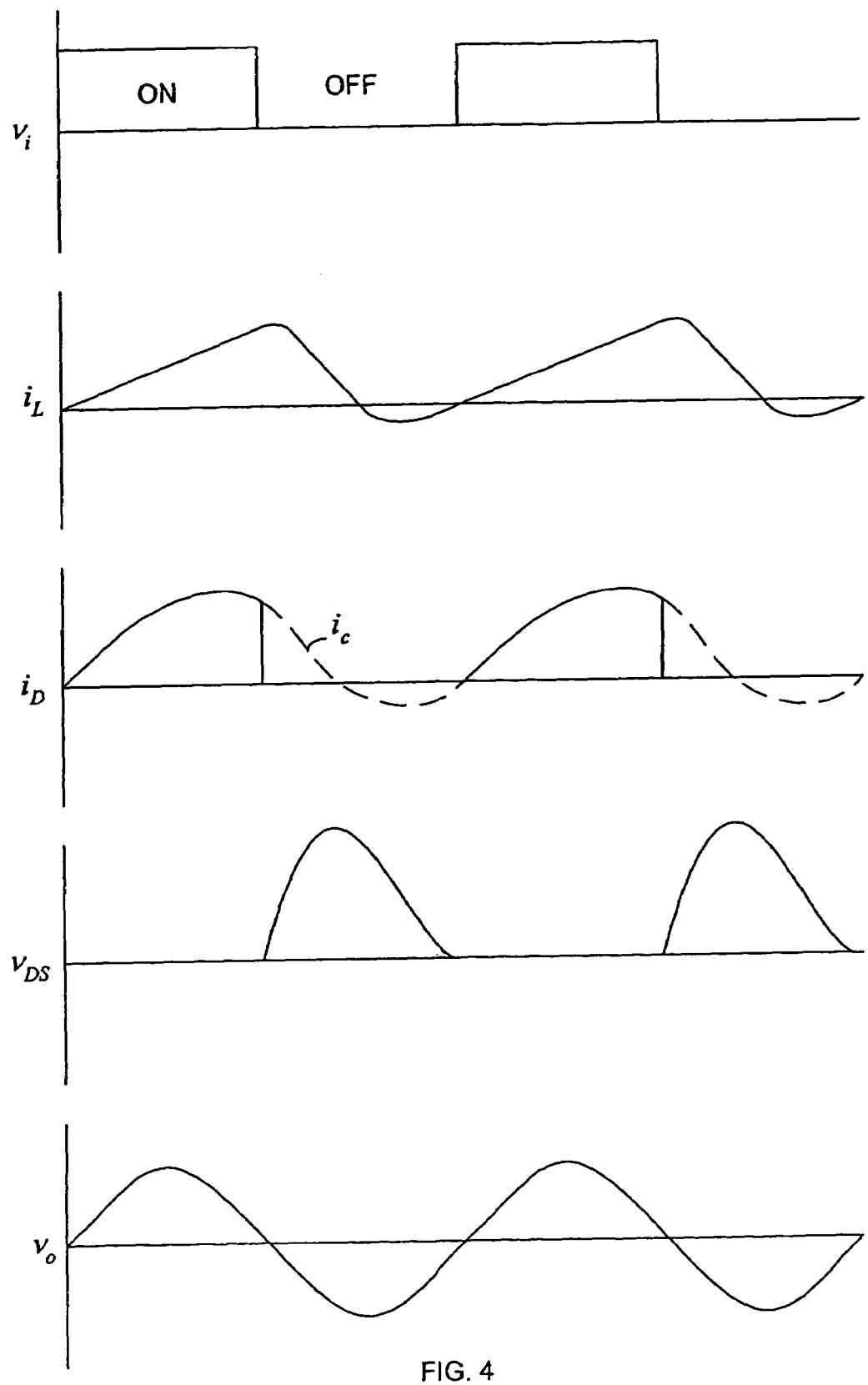
FIG. 4 illustrates voltage and current waveforms in the switch mode power amplifier of FIG. 1.

Illustrative curves for $v_i$, $V_{DS}$, $V_0$, $i_L$, $i_D$, and $i_c$ for two periods are shown on FIG. 4. As shown in FIG. 4, the drain voltage ($V_{DS}$) on the transistor 12 is zero while the device is on. When the input voltage vi goes below the device threshold, the device 12 cuts off and the drain voltage $V_{DS}$ begins to rise. As the current through the capacitor $i_C$ falls to zero, the drain voltage reaches its peak. When capacitor current becomes negative, the drain voltage begins to fall. The drain voltage reaches zero before the device 12 is turned on again. The drain voltage waveform is applied to the resonant circuit 14 which passes only the fundamental frequency of the drain voltage waveform, resulting in the illustrated shape of $v_0$.

Figure 2:
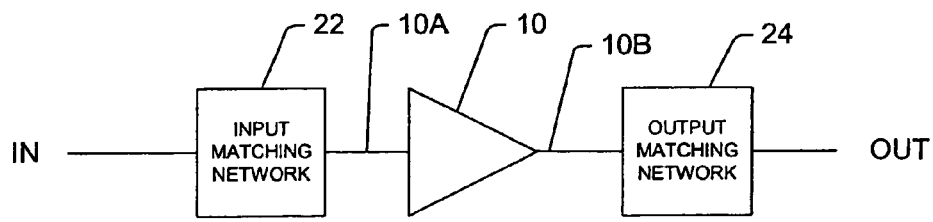
FIG. 2 is a functional block diagram of a switch mode power amplifier in accordance with the invention.

As illustrated in FIG. 2, an amplifier circuit 20 may include a Class E amplifier 10 having an input 10A and an output 10B. An input matching network 22 is coupled to the input 10A and an output matching network 24 is coupled to the output 10B of the amplifier 10. The input matching network 22 matches the impedance seen by the input signal $v_i$ to the input impedance of the amplifier 10, while the output matching network 24 transforms the output impedance of the amplifier 10 to a desired output impedance, e.g. 50 ohms.

As gate periphery of the transistor increases, it becomes more difficult to implement a suitable output matching circuit. The maximum gate periphery that may be utilized depends on a number of factors including drain voltage. With higher drain voltages, output matching circuits can be implemented for amplifier circuits including transistors with larger gate peripheries. Since the drain voltage and the drain current of the transistor are ideally never both simultaneously greater than zero, Class E amplifiers are capable of high drain efficiency and high power added efficiency (PAE). Drain efficiency is defined as the ratio of RF power output by the amplifier to DC power consumed by the amplifier.

$$\text{Drain Efficiency} = \frac{RF_{out}}{DC_{in}} * 100$$

Power added efficiency, which takes RF input power into account, is defined as the ratio of the output RF power less input RF power divided by DC power.

$$PAE = \frac{RF_{out} - RF_{in}}{DC_{in}} * 100$$

The RF power output by a Class E amplifier is proportional to the square of the supply voltage $V_{DD}$ of the circuit. Thus, total RF power output by a device may be increased by increasing the supply voltage. However, in conventional devices employing GaAs and silicon transistors, the supply voltage is limited due to the low breakdown voltage of the material. Moreover, in some applications it is desirable to re-introduce amplitude information from the input signal into the output signal. In some applications, that may be accomplished by modulating the supply voltage $V_{DD}$. Accordingly, it may be desirable to use a large $V_{DD}$ to provide a high dynamic range in the output voltage signal.

As discussed above, GaAs and silicon may not be well suited for higher power and/or high frequency applications, however, because of their relatively small bandgaps (e.g., 1.12 eV for Si and 1.42 for GaAs at room temperature) and/or relatively small breakdown voltages.

GaAs based transistors have become the standard for signal amplification in civil and military radar, handset cellular, and satellite communications. GaAs has a higher electron mobility (approximately 6000 cm$^2$/V-s) and a lower source resistance than Si, which may allow GaAs based devices to function at higher frequencies. However, GaAs has a relatively small bandgap (1.42 eV at room temperature) and relatively small breakdown voltage, which may prevent GaAs based HEMTs from providing high power at high frequencies. Higher power devices may be constructed by combining low power amplifier cells. However, even using low-loss combining techniques there is a limit to the number of cells that can be combined before losses from the combiner outweigh efficiency gains that may be realized using switch-mode amplifiers.

In light of the difficulties presented by Si and GaAs, interest in high power, high temperature and/or high frequency applications and devices has turned to wide bandgap semiconductor materials such as silicon carbide (3.28 eV for 4H-SiC at room temperature) and the Group III nitrides (e.g., 3.36 eV for GaN at room temperature). These materials typically have higher electric field breakdown strengths and higher electron saturation velocities as compared to gallium arsenide and silicon. As used herein, "wide bandgap" refers to semiconductor materials such as SiC and the group III-nitrides having a bandgap of about 3 eV and greater.

Figure 3:
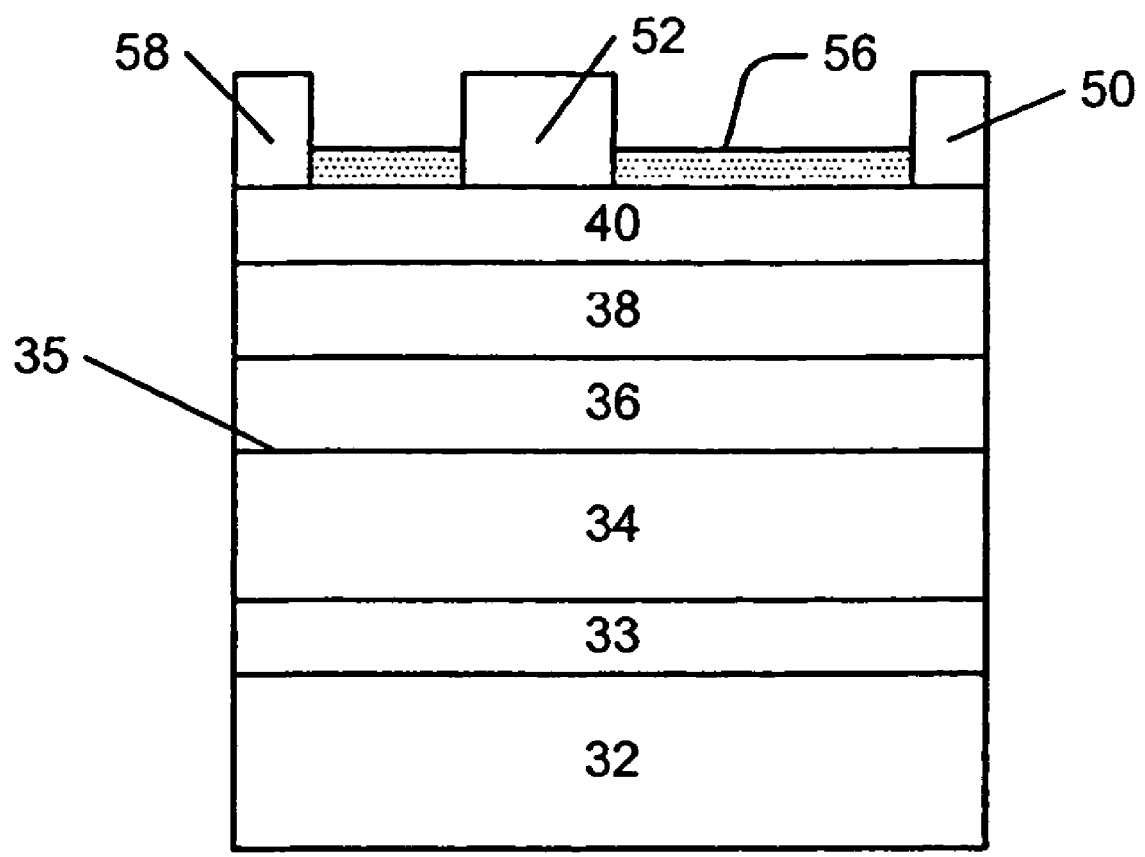
FIG. 3 is a section view of a high electron mobility transistor useful in the switch mode power amplifier in accordance with an embodiment of the invention.

In some embodiments of the present invention, the transistor 12 comprises a high electron mobility transistor (HEMT) 30 as illustrated in the cross-sectional view of FIG. 3. The transistor 30 includes a substrate 32 that may be, for example, semi-insulating silicon carbide (SiC) of the 4H polytype. Other silicon carbide polytypes including the 2H, 3C, 6H, and 15R polytypes may be utilized. The term "semi-insulating" is used descriptively in a relative sense rather than in an absolute sense. In particular embodiments of the present invention, the silicon carbide bulk crystal may have a resistivity equal to or higher than about $10^5$ Ω-cm at room temperature.

A buffer layer 33 on the substrate 32 provides an appropriate crystalline transition between the substrate 32 and the remainder of the device. Buffer layer 33 may include one or more layers of InAlGaN. In particular embodiments, buffer layer 33 may include AlN or AlGaN. Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance.

Although semi-insulating silicon carbide is the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In addition, the substrate may be conductive, semi-insulating or highly resistive. In embodiments comprising a MMIC, it is desirable to use a semi-insulating or highly resistive substrate. In some embodiments, an appropriate buffer layer also may be formed.

Suitable SiC substrates are manufactured by, for example, Cree, Inc., of Durham, N.C., the assignee of the present invention, and the methods for producing are described, for example, U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

Particular structures for GaN-based HEMTs are described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" and U.S. patent application Ser. No. 10/199,786, to Saxler, entitled "STRAIN BALANCED NITRIDE HETEROJUNCTION TRANSISTORS AND METHODS OF FABRICATING STRAIN BALANCED NITRIDE HETEROJUNCTION TRANSISTORS" the disclosures of which are hereby incorporated herein by reference in their entirety. Embodiments of the present invention may be incorporated into such structures and, therefore, should not be construed as limited to the particular structures described in detail herein.

Returning again to FIG. 3, a transistor 30 includes a channel layer 34. In some embodiments of the present invention, the channel layer 34 includes InAlGaN. In particular embodiments, the channel layer 34 includes $Al_xGa_{1-x}N$ ($0 \leq x \leq 1$). In some embodiments of the present invention, the channel layer 34 includes GaN. The channel layer 34 may be undoped and may be grown to a thickness of between about 1 and about 10 μm.

In some of the embodiments described above, it may be desirable for the semiconductor crystal structure to be oriented in a Ga-polar (or Group III polar) orientation to enhance the effect of the piezoelectric quality of the material. However, many of the embodiments, including the embodiment of FIG. 3, may be formed using N-polar or non-polar material without departing from the scope of the invention.

A barrier layer 36 is provided on the channel layer 34. The barrier layer 36 may be a Group III-nitride having a bandgap larger than that of the channel layer 34. Accordingly, the barrier layer 36 may be AlGaN, AlInGaN, AlInN and/or AlN. The barrier layer 36 may be at least about 0.5 nm thick depending on the material from which it is formed. For example, an AlGaN barrier layer may be at least about 10 nm. The barrier layer 36 should be thin enough that it is completely depleted under equilibrium conditions.

Preferably, the barrier layer 36 is undoped or doped with activated donor atoms at a concentration of less than about $10^{19}$ cm$^{-3}$. In some embodiments, the barrier layer 36 may be delta-doped at a concentration of up to about $10^{13}$ cm$^{-2}$ at a distance of about 100 Å from the interface between barrier layer 36 and channel layer 34. In some embodiments of the invention, the barrier layer 36 includes $Al_xGa_{1-x}N$ where $0 \leq x \leq 1$. In certain embodiments of the present invention, the barrier layer 36 includes AlGaN with an aluminum concentration of between about 5% and about 100%. In specific embodiments of the present invention, the aluminum concentration is greater than about 10%. The barrier layer 36 has a bandgap greater than that of the channel layer 34.

The barrier layer may also be provided with multiple layers as described in U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" and U.S. Pat. No. 6,316,793 entitled "NITRIDE BASED TRANSISTORS ON SEMI-INSULATING SILICON CARBIDE SUBSTRATES WITH PASSIVATION LAYER" issued Nov. 13, 2001, the disclosures of which are incorporated herein by reference as if set forth fully herein. Thus, embodiments of the present invention should not be construed as limiting the barrier layer to a single layer but may include, for example, barrier layers having combinations of InAlGaN layers having various material compositions. For example, a GaN/AlN structure may be utilized to reduce or prevent alloy scattering.

In the embodiment illustrated in FIG. 3, barrier layer 36 comprises a 0.6 nm layer of AlN. A lower bandgap layer 38 comprising $Al_xGa_{1-x}N$ is formed on barrier layer 36. Layer 38 has an aluminum composition between about 14% and 30% (i.e. $0.14 \leq x \leq 0.3$).

An optional InAlGaN contact layer or cap layer 40 may be provided on the barrier layer 36 to facilitate the formation of contacts of the transistor 30. An example of such a cap layer is disclosed in U.S. application Ser. No. 09/904,333 filed Jul. 12, 2001 for "ALUMINUM GALLIUM NITRIDE/ GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," which is referenced above. In the illustrated embodiment, cap layer 40 comprises a 4 nm layer of undoped GaN.

In addition, there may be a compositionally graded transition layer (not shown) between the barrier layer 36 and the contact or cap layer. The source contact 58, the drain contact 50 and the gate contact 52 may be fabricated as described in U.S. Pat. No. 6,316,793.

A passivation layer 56 may be formed on exposed surfaces of the device as discussed in U.S. Pat. No. 6,586,781 entitled "GROUP III NITRIDE BASED FETS AND HEMTS WITH REDUCED TRAPPING AND METHOD FOR PRODUCING THE SAME" and U.S. patent application Ser. No. 10/851,507 entitled "DIELECTRIC PASSIVATION FOR SEMICONDUCTOR DEVICES," the disclosures of which are incorporated herein by reference as if set forth fully herein.

As discussed above, a 2DEG sheet charge region 35 is induced at the interface between channel layer 34 and barrier layer 36. Moreover, the buffer 33 may be doped with deep acceptors as described in S. Heikman et al., Growth of Fe-Doped Semi-insulating GaN by Metalorganic Chemical Vapor Deposition, Appl. Phys. Let. 81, pp. 439–441 (2002). Specific examples of co-doped layers are provided in U.S. patent application Ser. No. 10/752,970 entitled "CO-DOPING FOR FERMI LEVEL CONTROL IN SEMI-INSULATING GROUP III NITRIDES", filed Jan. 7, 2004 and assigned to the assignee of the present invention, the disclosure of which is incorporated herein by reference. The buffer could be doped with Fe or another deep acceptor.

Figure 5:
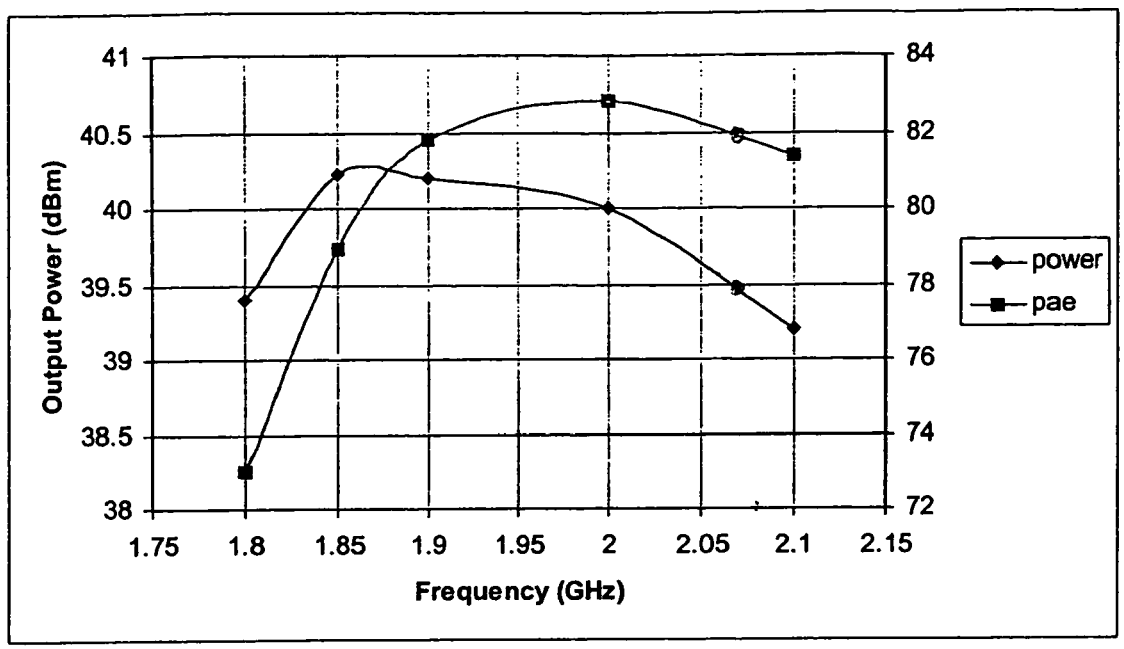
FIGS. 5 and 6 are graphs of frequency versus output power and power added efficiency for two single stage amplifiers in accordance with the invention.
Figure 6:
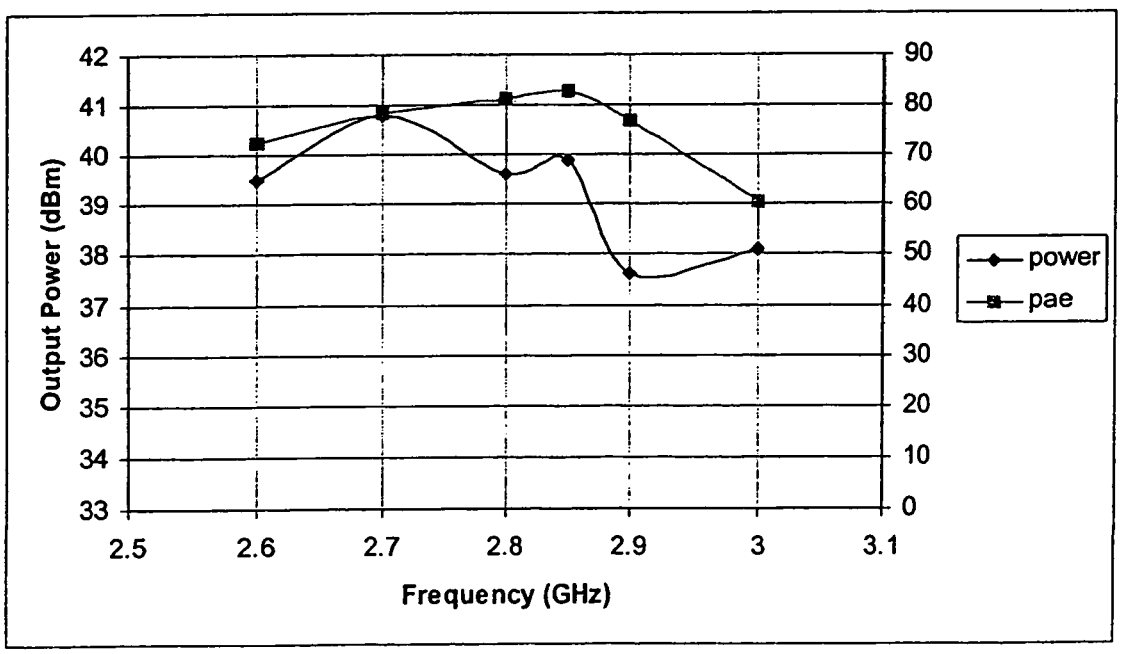

FIGS. 5 and 6 are graphs of power output and power added efficiency for two single-stage amplifiers constructed in accordance with the present invention. Each circuit utilized a GaN based HEMT as described above in connection with FIG. 3. Each of the devices had a total gate periphery of 3.6 mm, and in each circuit, the drain voltage ($V_{DD}$) was 30 V. The first amplifier, whose characteristics are illustrated in FIG. 5, was designed for operation at 2 GHz. The second amplifier, whose characteristics are illustrated in FIG. 6, was designed for operation at 2.8 GHz. As illustrated in FIG. 5, the first amplifier circuit achieved an output power of approximately 40 dBm (10 watts) and a power added efficiency greater than 82% at 2.0 GHz. Moreover, over a 200 MHz bandwidth from 1.9 GHz to 2.1 GHz, the first amplifier circuit exhibited power added efficiency greater than 75% and power output over 40 dBm.

As illustrated in FIG. 6, the second amplifier circuit achieved an output power of approximately 39.5 dBm (approximately 8.9 watts) and a power added efficiency greater than 80% at 2.8 GHz. Moreover, over a 200 MHz bandwidth from 2.7 GHz to 2.9 GHz, the second amplifier circuit exhibited power added efficiency greater than 75% and power output over 37 dBm.

Figure 7:
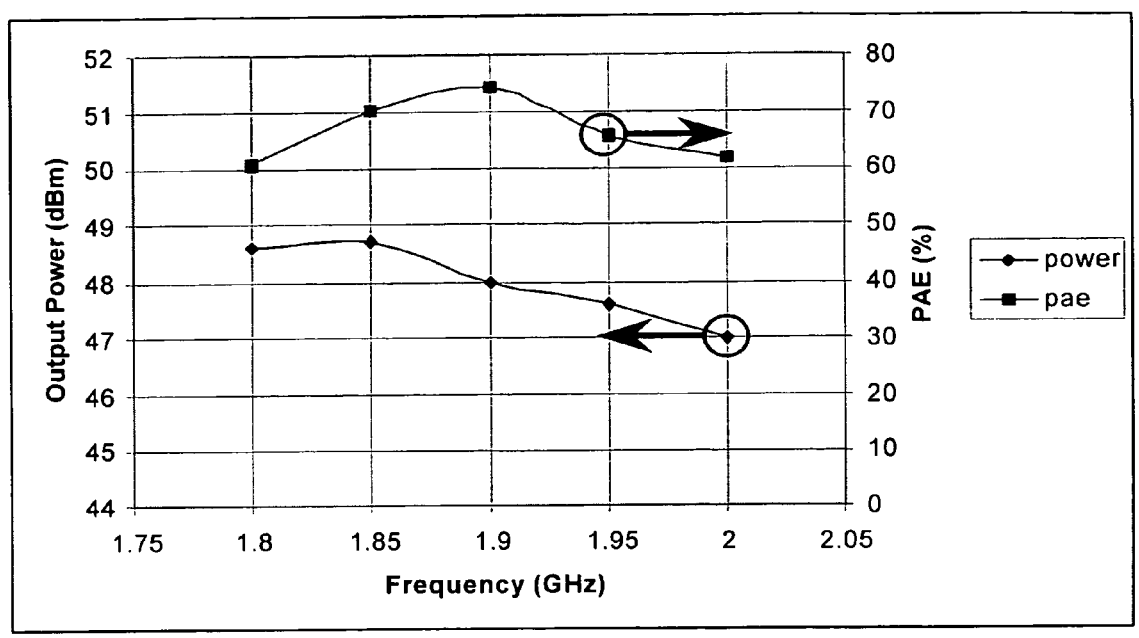
FIG. 7 is a graph of frequency versus output power and power added efficiency for a 60 watt power amplifier in accordance with an embodiment of the invention.

Higher power levels may be possible using device structures with higher power densities. For example, power densities in excess of 30 W/mm have been demonstrated by the assignee of the present invention. In addition, higher power circuits may be constructed by combining amplifier cells in other topologies. For example, amplifier cells may be combined using a push-pull topology in which the amplifier circuits are 180° out of phase with each other. FIG. 7 is a graph for a 60 watt Class E power amplifier in accordance with an embodiment of the invention using a 30 mm GaN HEMT active device.

Thus, while the invention has been described with reference to specific embodiments, the description is illustrative of the invention and is not to be construed as limiting the invention. Various modifications and applications may occur to those skilled in the art without departing from the true scope and spirit of the invention as defined by the appended claims.

In some embodiments, the invention comprises a wide bandgap-based microwave monolithic integrated circuit (MMIC) such as a SiC or GaN MMIC comprising a wide bandgap transistor integrated on a substrate with distributed circuit elements to form a monolithic Class E amplifier circuit as described above. Further, the invention applies to MOS and LDMOS technologies and to other frequencies including 802.11 and 802.16 bands (i.e. 2.4 GHz, 25., 2.7, 3.4 to 3.8 and 5.3 to 5,8 GHz). The MMIC may further include input and/or output matching networks and other distributed or lumped circuitry.

The invention claimed is:

1. A switch mode power amplifier for higher frequency applications comprising:
    a) a transistor having a first terminal, a second terminal, and a control terminal and having internal capacitance between the first terminal and second terminal,
    b) a signal input terminal coupled to the control terminal,
    c) a power terminal conductively coupled to the second terminal,
    d) a ground terminal coupled to the first terminal,
    e) a resonant circuit coupling the second terminal to an output terminal, and
    f) a resistance coupling the output terminal to the ground terminal,
    whereby an input signal controls conduction of the transistor and the second terminal is coupled to ground when the transistor is conducting with current from a power source to the second terminal increasing, and when the transistor is turned off current from the power supply is steered into the internal capacitance of the transistor and causes voltage on the second terminal to rise to a maximum value and then decrease, the voltage at the second terminal being coupled to the output terminal through the resonant circuit, and
    wherein the transistor comprises a compound semiconductor field effect transistor with the first terminal being a source terminal and the second terminal being a drain terminal, the transistor comprising:
    a compound semiconductor substrate, a buffer layer formed on the substrate, a channel layer formed on the buffer layer, and a barrier layer formed on the channel.

2. The switch mode power amplifier as defined by claim 1 wherein the transistor comprises a high electron mobility transistor (HEMT).

3. The switch mode power amplifier as defined by claim 2 wherein the compound semiconductor substrate comprises a wide bandgap compound material.

4. The switch mode power amplifier as defined by claim 2 wherein the semiconductor substrate is selected from the group consisting of silicon carbide and periodic table group III nitrides.

5. The switch mode power amplifier as defined by claim 1 wherein the substrate comprises silicon carbide and the other layers comprise group III nitride material.

6. The switch mode power amplifier as defined by claim 5 wherein the substrate comprises silicon carbide, the buffer layer comprises InAlGaN, the channel layer comprises InAlGaN, and the barrier layer comprises a first group III nitride.

7. The switch mode power amplifier as defined by claim 6 wherein the transistor further includes a second group III nitride layer formed on the barrier layer, the second group III nitride layer having a lower bandgap than the first group III nitride layer.

8. The switch mode power amplifier as defined by claim 7 wherein the second group III material comprises AlGaN.

9. The switch mode power amplifier as defined by claim 7 wherein the transistor further includes a cap layer formed on the second group III nitride layer to facilitate the formation of contacts to the transistor.

10. The switch mode power amplifier as defined by claim 9 wherein the cap layer comprises a group III nitride.

11. The switch mode power amplifier as defined by claim 10 wherein the cap layer comprises InAlGaN.

12. The switch mode power amplifier as defined by claim 1, wherein the compound semiconductor substrate comprises a wide bandgap compound material and wherein said switch mode amplifier is configured to produce in excess of 40 dBm of output power at a frequency in excess of 1.9 GHz.

13. The switch mode power amplifier as defined by claim 1, wherein the compound semiconductor substrate comprises a wide bandgap compound material and wherein said switch mode amplifier is configured to exhibit in excess of 75% power added efficiency at a frequency in excess of 1.9 GHz.

14. The switch mode power amplifier as defined by claim 1, wherein the compound semiconductor substrate comprises a wide bandgap compound material and wherein said switch mode amplifier is configured to produce in excess of 40 dBm of output power and exhibits a power added efficiency in excess of 75% over a bandwidth from 1.9 GHz to 2.1 GHz.

15. The switch mode power amplifier as defined by claim 1, wherein the compound semiconductor substrate material comprises a wide bandgap compound material and wherein said switch mode amplifier is configured to produce in excess of 39 dBm of output power at a frequency in excess of 2.7 GHz.

16. The switch mode power amplifier as defined by claim 1, wherein the compound semiconductor substrate comprises a wide bandgap compound material and wherein said switch mode amplifier is configured to exhibit in excess of 75% power added efficiency at a frequency in excess of 2.7 GHz.

17. The switch mode power amplifier as defined by claim 1, wherein the compound semiconductor substrate comprises a wide bandgap compound material and wherein said switch mode amplifier is configured to produce in excess of 37 dBm of output power and exhibits a power added efficiency in excess of 75% over a bandwidth from 2.7 GHz to 2.9 GHz.

18. The switch mode power amplifier as defined by claim 1, wherein the transistor comprises a 30 mm GaN HEMT capable of 60 watt power output.

19. The switch mode power amplifier as defined by claim 18, wherein the transistor performance exceeds 51 dBm at 1.9 GHz.

* * * * *